United States Patent
Guidash et al.

(10) Patent No.: US 6,218,692 B1
(45) Date of Patent: *Apr. 17, 2001

(54) COLOR ACTIVE PIXEL SENSOR WITH ELECTRONIC SHUTTERING, ANTI-BLOOMING AND LOW CROSS TALK

(75) Inventors: Robert M. Guidash, Rochester; Paul P. Lee, Pittsford, both of NY (US); Teh-Hsuang Lee, Carlsbad, CA (US)

(73) Assignee: Eastman Kodak Company, Rochester, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 09/448,375

(22) Filed: Nov. 23, 1999

(51) Int. Cl.[7] ........... H01L 31/062; H01L 31/113; H01L 27/148; H01L 29/768
(52) U.S. Cl. ........... 257/292; 257/234; 257/294; 257/432; 257/435; 257/440
(58) Field of Search ........... 257/291, 292, 257/432, 435, 223, 230, 234, 294, 440

(56) References Cited

U.S. PATENT DOCUMENTS

| 4,373,167 | 2/1983 | Yamada | 357/24 |
|---|---|---|---|
| 4,467,341 | 8/1984 | Suzuki | 357/24 |
| 4,696,021 | 9/1987 | Kawahara et al. | 377/58 |
| 4,928,158 | 5/1990 | Kimata | 357/24 |
| 4,958,207 | 9/1990 | Suni et al. | 357/24 |
| 4,977,584 | 12/1990 | Kohno et al. | 377/58 |
| 5,028,970 | 7/1991 | Masatoshi | 357/30 |
| 5,235,197 | 8/1993 | Chamberlain et al. | 257/230 |
| 5,479,049 | 12/1995 | Aoki et al. | 257/642 |
| 5,493,143 | 2/1996 | Hokari | 257/432 |
| 5,631,704 | 5/1997 | Dickinson et al. | 348/308 |
| 5,739,548 | * 4/1998 | Shigeta et al. | 257/59 |
| 5,789,774 | * 8/1998 | Merrill | 257/292 |
| 5,841,158 | * 11/1998 | Merrill | 257/233 |
| 5,867,215 | * 2/1999 | Kaplan | 348/315 |
| 5,880,495 | * 3/1999 | Chen | 257/233 |
| 5,892,253 | * 4/1999 | Merill | 257/292 |
| 5,977,576 | * 11/1999 | Hamasaki | 257/292 |
| 5,986,297 | * 11/1999 | Guidash et al. | 257/223 |

OTHER PUBLICATIONS

"Active Pixel Sensors: Are CCD's Dinosaurs?", Jul., 1993, by Eric R. Fossum, *SPIE*, vol. 1900–08–8194–1133,.

"128×128 CMOS Photodiode–Type Active Pixel Sensor With On–Chip Timing, Control and Signal Chain Electronics", by R. H. Nixon et al., *Proceedings of the SPIE*, vol. 2415, "Charge–Coupled Devices and Solid–State Optical Sensors V", paper 34 (1995), pp. 1–7.

"Technology and Device Scaling Considerations For CMOS Imagers", by Hon–Sum Wong, *IEEE Transactions On Electron Devices*, vol. 43, No. 12, Dec. 1996, pp. 2131–2142.

* cited by examiner

Primary Examiner—Ngân V. Ngô
(74) Attorney, Agent, or Firm—Peyton C. Watkins

(57) ABSTRACT

An active pixel sensor architecture comprising a semiconductor substrate having a plurality of pixels formed, thereon, incorporating microlens and lightshields into the pixel architecture. Each of the pixels further comprising: a photodetector region upon which incident light will form photoelectrons to be collected as a signal charge; a device for transferring the signal charge from the photodetector region to a charge storage region that is covered by a light shield; a sense node that is an input to an amplifier; the sense node being operatively connected to the signal storage region. The pixel architecture facilitates symmetrical design of pixels which allows for incorporation of light shield and microlens technology into the design.

21 Claims, 3 Drawing Sheets

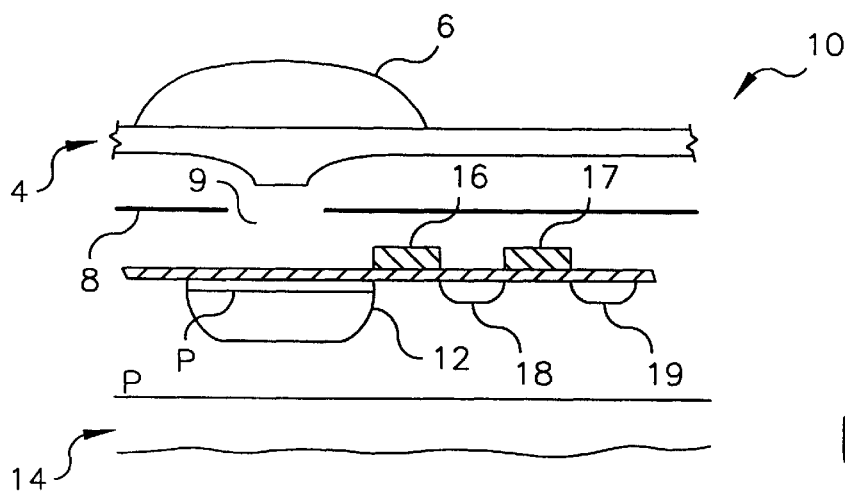
FIG. 1A
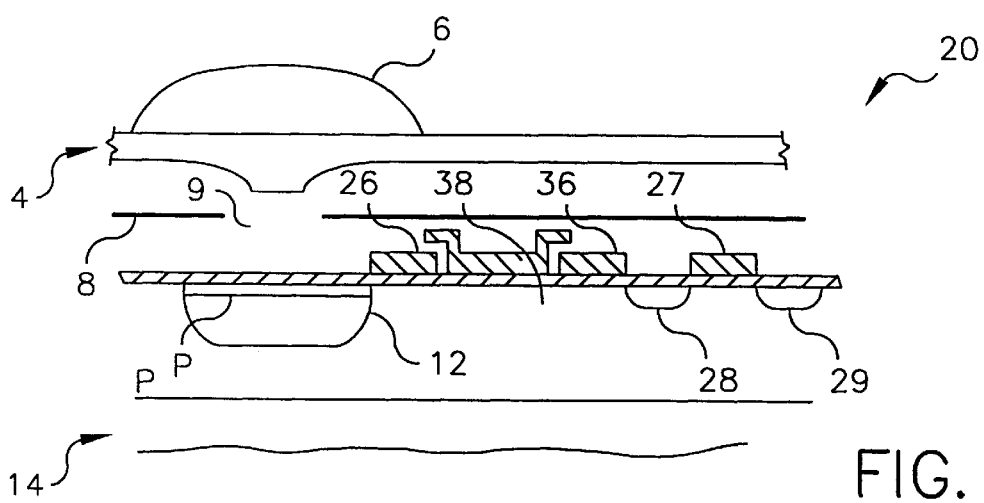
FIG. 1B
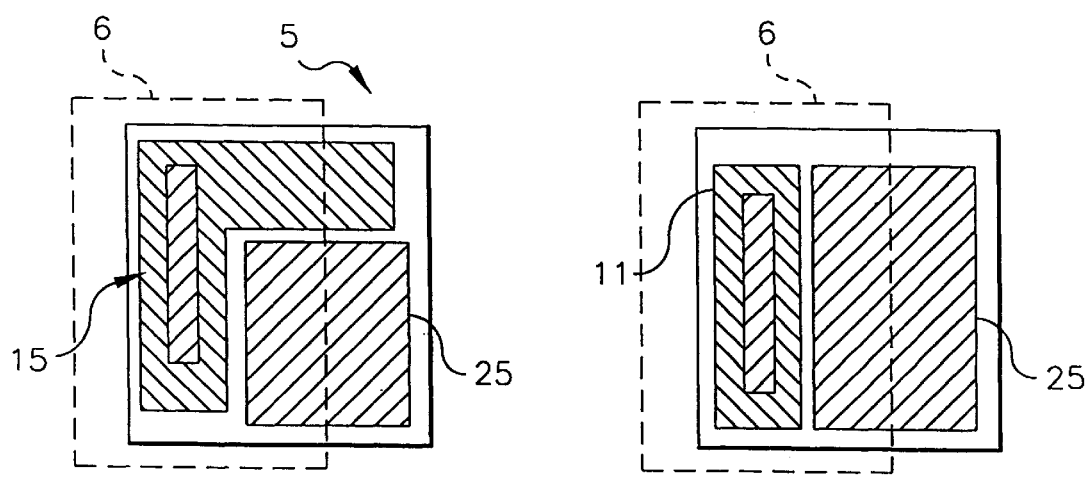
FIG. 2A
(PRIOR ART)
FIG. 2B

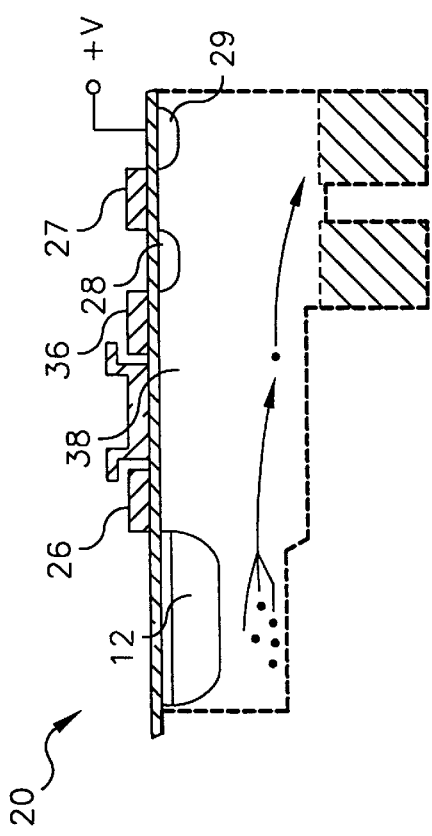
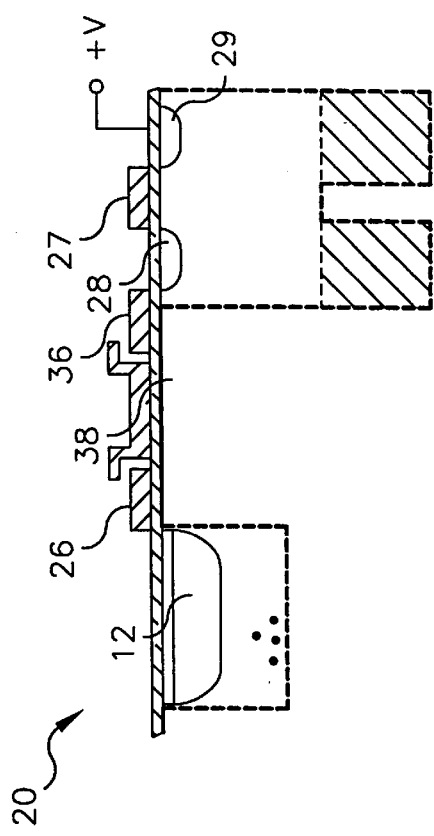
FIG. 3A
FIG. 3B
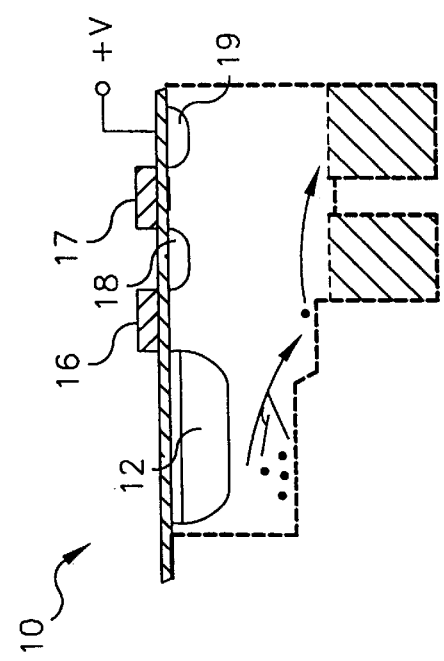
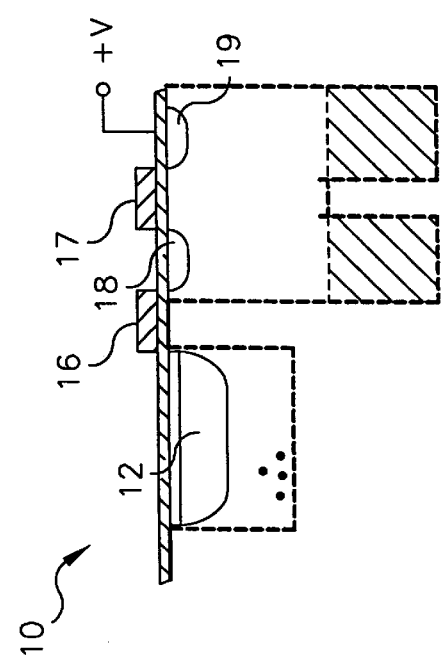
FIG. 4A
FIG. 4B

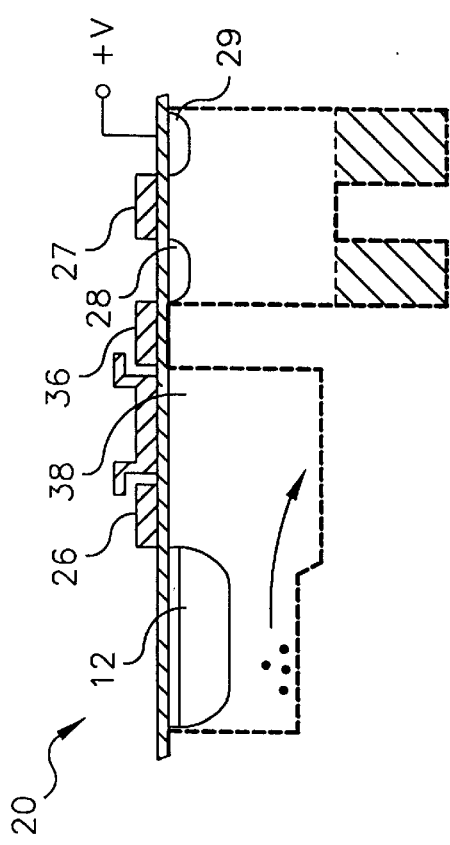
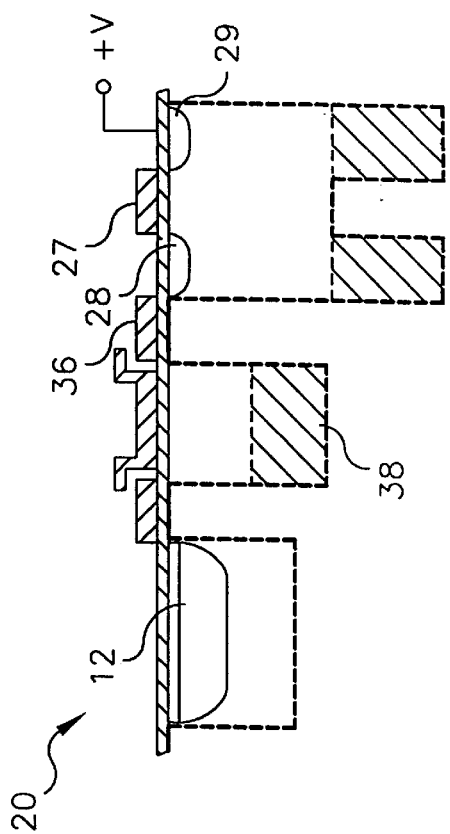
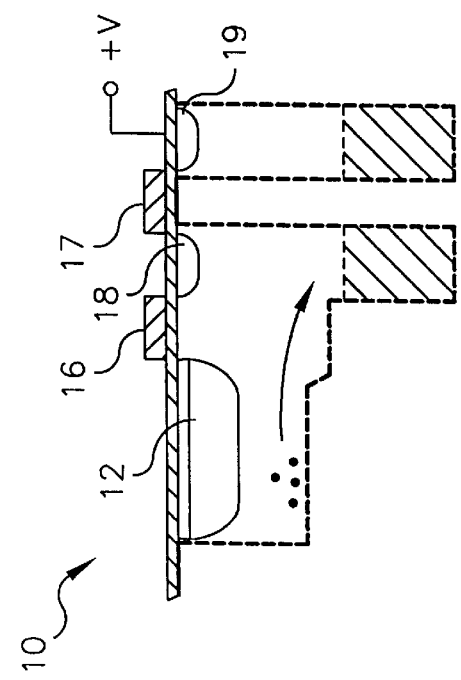
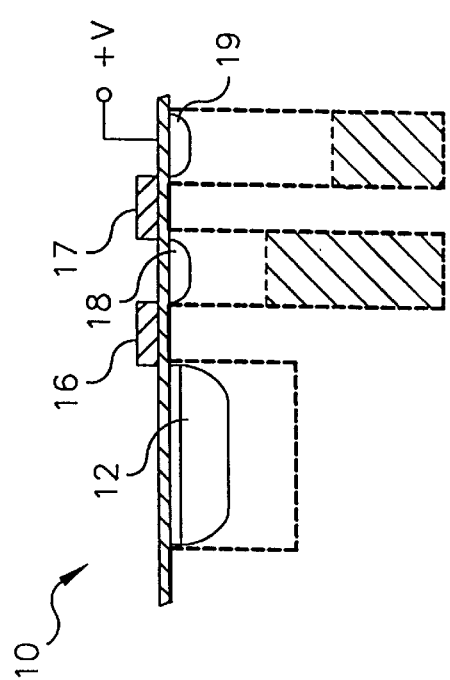

COLOR ACTIVE PIXEL SENSOR WITH ELECTRONIC SHUTTERING, ANTI-BLOOMING AND LOW CROSS TALK

CROSS-REFERENCE TO RELATED APPLICATIONS

The present application is related to U.S. application Ser. No. 09/447,494, filed Nov. 23, 1999, entitled "A Color Active Pixel Sensor With Electronic Shuttering, Anti-Blooming And Low Cross-Talk" by Robert M. Guidash, et al.; and U.S. application Ser. No. 08/800,947, filed Feb. 13, 1997, now issued as U.S. Pat. No. 5,986,297, entitled "A Color Active Pixel Sensor With Electronic Shuttering, Anti-Blooming And Low Cross-Talk" by Robert M. Guidash, et al.

FIELD OF INVENTION

The present invention relates generally to the field of solid state photosensors, and in particular to Active Pixel Sensors (APS).

BACKGROUND OF THE INVENTION

APS are solid state imagers where each pixel contains a photosensing means, charge to voltage conversion means, reset means and all or part of an amplifier. APS devices are typically operated in a manner wherein each line, or row, of the imager is integrated, read out and then reset at a different time interval. Therefore, in reading out the entire image, each line has captured the scene at a different point in time. Since illumination conditions vary temporally, and since objects in the scene may also be moving, this method of read out can produce line artifacts in the resulting representation of the image. This limits the usefulness of APS devices in applications where high quality motion or still images are required.

Additionally, the charge to voltage conversion region, and other active transistor regions (i.e. other than the photosensing region), of APS devices are not shielded from the scene illumination. As a result, free electrons will be generated in those regions. These electrons are not effectively confined to the pixel in which they were generated, and can diffuse into adjacent pixels. This causes a degradation of the spatial accuracy of the image signal, and the modulation transfer function (MTF) of the image sensor. This is especially problematic in color image sensors where this pixel cross-talk leads to color mixing, adversely affecting the color balance of the image.

Since APS devices are typically fabricated in CMOS foundries, they do not incorporate color filter arrays (CFA) or micro-lens arrays ($\mu$Lens), and the shape and size of the photosensing area has not been optimized for incorporation of CFA and $\mu$Lens. A reason for this is that prior art active pixel sensors are typically monochrome. For most imaging applications it is desirable to have a color sensor. Even if CFA and $\mu$Lens were placed on prior art APS devices, the resulting images would have poor color MTF due to crosstalk and photosensing area that has not been optimized.

To solve the above discussed problems, it is desirable to perform integration at the same point and interval of time for every pixel, and subsequently transfer this charge to a storage region in each pixel that is shielded from the scene illumination. This is referred to as frame integration. It is also desirable to have all regions except for the photodetector effectively shielded from the scene illumination to improve the MTF. It is further desirable to provide blooming control during integration, and more importantly for frame integration, during storage and read out of the device. Finally, it is desirable to incorporate CFA and $\mu$Lens, and design the photosensing region to enable effective use of CFA and $\mu$Lens. These and other issues are solved by the teachings of the present invention.

SUMMARY OF THE INVENTION

A new APS device pixel architecture, and method of operation, has been devised that uses simultaneous integration of the scene illumination at each pixel, and subsequent simultaneous transfer of signal electrons at each pixel to a light shielded charge storage region. It comprises an alternative charge integration and transfer scheme, and pixel architecture that enable contemporaneous electronic shuttering and image capture and storage of all pixels on the sensor. This is provided by the present invention active pixel sensor comprising a semiconductor substrate having a plurality of pixels formed on the substrate such that at least one of the pixels has: a photodetector region upon which incident light will form photoelectrons to be collected as a signal charge, a color filter above the photodetector region, a light shield over at least the charge storage region having an aperture above the photodetector region, a means for transferring the signal charge from the photodetector region to a charge storage region, a sense node that is an input to an amplifier, the sense node being operatively connected to the signal storage region.

In this invention the shape of the photodetector is designed with dimensional symmetry so that a $\mu$Lens could be used to maximize the effective fill factor, and provide high quality color images.

These and other aspects, objects, features and advantages of the present invention will be more clearly understood and appreciated from a review of the following detailed description of the preferred embodiments and appended claims, and by reference to the accompanying drawings.

Advantageous Effect of the Invention

Reset and integration at each pixel simultaneously once per frame eliminates artifacts caused by changing scene illumination or scene motion. Light shielding of the pixel including the charge storage region allows this operation.

Creation of an aperture within the light shield at least over the photodetector region, improves device MTF by preventing generation of photoelectrons in regions outside of the photodetector of a given pixel from being collected in the photodetector or charge storage region of adjacent pixels. Inclusion of a photodetector lateral or vertical overflow drain (LOD or VOD), provides blooming control during storage and read out. Inclusion of CFA and microlenses and an appropriately designed photodetector region provides high quality color images.

BRIEF DESCRIPTION OF THE DRAWINGS

FIG. 1A is a cross sectional diagram of a pixel as envisioned by the present invention;

FIG. 1B is a cross sectional diagram of a second embodiment of the present invention;

FIG. 2A is a diagram of a typical prior art pixel for an Active Pixel Sensor;

FIG. 2B is a diagram of a pixel for an Active Pixel Sensor as envisioned by the present invention;

FIG. 3A is an electrostatic diagram for the reset function of the present invention shown in FIG. 1A;

FIG. 3B is an electrostatic diagram for the reset function of the present invention shown in FIG. 1B;

FIG. 4A is an electrostatic diagram for the integration function of the present invention shown in FIG. 1A;

FIG. 4B is an electrostatic diagram for the integration function of the present invention shown in FIG. 1B;

FIG. 5A is an electrostatic diagram for the transfer function of the present invention shown in FIG. 1A;

FIG. 5B is an electrostatic diagram for the transfer function of the present invention shown in FIG. 1B;

FIG. 6A is an electrostatic diagram for the store function of the present invention shown in FIG. 1A; and FIG. 6B is an electrostatic diagram for the store function of the present invention shown in FIG. 1B.

To facilitate understanding, identical reference numerals have been used, where possible, to designate identical elements that are common to the figures.

DETAILED DESCRIPTION OF THE INVENTION

We have discovered a new APS device pixel architecture, and method of operation, that uses simultaneous integration of the scene illumination at each pixel, and subsequent simultaneous transfer of signal electrons at each pixel to a light shielded charge storage region. This pixel architecture and method of operation eliminates the image artifacts caused by the line by line integration and read out method of prior art APS devices, while maintaining electronic shuttering capability and antiblooming control.

FIG. 1A and FIG. 1B illustrate cross sections of two different embodiments of the present invention illustrating relevant regions of the pixel architecture. While it will be understood to those skilled in the art that numerous variations of the specific physical embodiments of this invention can be achieved, these preferred embodiments are chosen for example and illustration. For example, the photodetector shown in FIGS. 1A and 1B as a pinned photodiode, could be any photosensing means such as a photogate or photodiode that do not have pinning layers.

The pixel in FIG. 1A comprises a photodiode 12 with a vertical overflow drain 14, transfer gate 16, floating diffusion 18, reset gate 17, reset drain 19, and a light shield 8. A light shield aperture 9, color filter 4, and μLens 6 are placed over the photodetector such that light is focused through microlens 6 into light shield aperture 9 after passing through color filter 4. Therefore, the light entering photodiode 12 has a wavelength that is within a predetermined bandwidth as determined by the color filter 4.

FIG. 1B is a cross sectional diagram of a second embodiment of the present invention, and is similar in many respects to the embodiment shown in FIG. 1a except that there are two transfer gates 26, 36, and a storage region 38. In both cases the light shield is constructed by effectively covering all regions except the photodetectors (photodiode 12 in this case), with an opaque layer or overlapping layers, so that incident light falls only on the photodiode area. Creation of an aperture in a light shield that limits the creation of photoelectrons to the photodetector region suppresses cross-talk between pixels.

A comparison of prior art APS pixels to the present invention is seen by comparing FIG. 2A to FIG. 2B. The prior art device 5 would simply pack the required active transistors into a region as small as possible, as indicated as amplifier area 25, and then allocate the remaining pixel area to the photodetector area 15, without regard to the resulting shape of the photodetector. As a result the photodetector, lacked dimensional symmetry, and is not well suited for incorporation of CFA and μLens. Still referring to FIG. 2, the present invention employs a symmetrically shaped photodetector area, seen here as rectangular photodetector area 11, that is symmetric in 2-dimensions about its center. While a rectangular photodetector is shown, a square, elliptical or circular shaped photodetector is also envisioned. The symmetry of the photodetector makes possible an economical manner of placing light shield 8, aperture 9, color filter 4 and micro-lens 6 above the photodetector region. This provides the ability to make a pixel with the same fill factor as the prior art pixel, with a physically smaller pixel. Alternatively, one can keep the same pixel size and allocate a larger area to the amplifier, providing more amplifier design flexibility, and maintain the same fill factor as the prior art pixel. This can be seen in comparing FIGS. 2A and 2B. If one places a microlens over a prior art pixel as shown in FIG. 2A, such that the incident light is focused onto the photodetector as is indicated, the fill factor of the pixel is maximized. However, in order to focus the light into the area as shown, the microlens must be offset from the pixel center. Consequently, there is no longer any benefit to having photodetector area in the upper right hand corner of the pixel. Additionally, since there is an increase of the physical size of the photodetector without any benefit in fill factor, the capacitance of the photodetector is unnecessarily large. This will adversely affect the sensitivity in the case of a photodiode or photogate detector. It will also increase the amount of pixel cross-talk and reduce the latitude of color filter array overlap, producing a degradation in the MTF of the sensor.

If the pixel and photodetector layout were modified as shown in the present invention of FIG. 2B, and a microlens similarly employed as shown in FIG. 2B, the fill factor is identical to that of the prior art pixel. The modification can be accomplished by keeping the pixel size the same and allocating more pixel area to the amplifier. This provides lower fixed pattern noise and 1/f noise. The modification can also be accomplished by simply eliminating the part of the photodetector in the upper right hand corner of the prior art pixel, thus reducing the size of the pixel. This provides a higher resolution sensor with the same fill factor. Prior art APS sensors are typically monochrome, and their corresponding fabrication techniques did not elicit the type of architecture that lends itself to color pixel architecture. Additionally, prior art APS pixels did not provide a light shield within the pixel, and did not employ a microlens.

Reset Operation

FIG. 3A illustrates the reset operation for the pixel 1 in FIG. 1A.

The pixel 10 is reset by turning both Transfer Gate 16 and Reset Gate 17 on, as shown. Any electrons in the photodiode 12, and floating diffusion 18 are pulled out through the reset drain 19. This is done simultaneously at each pixel, and done once per frame.

With the reset mode of operation shown in FIG. 3A, correlated double sampling cannot be used since the reset level is not available immediately prior to the read level, on a per line, or per pixel rate. Consequently, the benefits of CDS are lost. However, since the reset level can be obtained after a read operation, amplifier offset cancellation can be accomplished. In practice the amplifier offset noise is more objectionable than the reset and 1/f noise that is removed by CDS. Therefore, this reset mode of operation is still sufficient absent correlated double sampling.

FIG. 3B illustrates the reset operation for the pixel 2 shown in FIG. 1B, where the pixel 20 is reset by turning on Transfer Gate 26, Storage region 38, Transfer Gate 36 and Reset Gate 27. In a manner similar to the first embodiment discussed above, any electrons in the photodiode 12, floating diffusion 28, and storage region 38 are pulled out through the reset drain 29. Again, this is done simultaneously at each pixel, and done once per frame.

Referring to FIG. 1B, another reset mode can be employed, by pulsing the VOD 14 (or turning on the lateral overflow drain (LOD) if used instead of a VOD). This empties the photodiode 12 only. The floating diffusion 28 can then be reset on a line by line basis (as in prior art, except reset is done before read) so that a reset level can be stored and used for correlated double sampling.

Frame Integration Operation

Image integration is accomplished by collecting photo-generated electrons in the photodiode. Referring to the device of FIG. 1A, the transfer gate 16 is placed at a voltage that provides an electrostatic barrier between the photodiode and the floating diffusion (transfer gate 16 off state), and the reset gate 17 is held either in its on or off state (see FIG. 4A).

Referring to the device shown in FIG. 1B, integration is done with transfer gate 26 in the off state as shown in FIG. 4B. Here, the storage region 38 and transfer gate 36 can be on or off, but preferably storage region 38 is kept in an off state to reduce cross-talk, see FIG. 4B. Keeping reset gate 27 and transfer gate 36 on during this time will eliminate dark current signal from building up in the floating diffusion 28 or storage region 38, and allows long integration times. The integration time is determined by the time between the photodetector reset and transfer (see transfer operation described below).

Transfer and Storage Operation:

After the desired integration time has elapsed, charge is transferred from the photodiode to the floating diffusion or storage region. In the device shown in FIG. 1A, this is done by pulsing transfer gate 16 on (i.e. by making the electrostatic potential under transfer gate 16 deeper than the potential of photodiode 12). Reset gate 17 must be turned off prior to transfer (see FIG. 5A).

For the device of FIG. 1B, transfer is accomplished as shown in FIG. 5B, by pulsing transfer gate 26 on and turning storage region 38 on while keeping transfer gate 36 off. In each architecture, charge transfer is done simultaneously at each pixel. Since the floating diffusion and storage region 38 regions are shielded from the scene illumination and are protected from blooming of charge in the photodiode, the signal can be stored on the floating diffusion or under the storage region without being modulated by the scene illumination.

Read Operation

Referring to FIG. 6A., which show the read operation for the device of FIG. 1A, the charge is already residing on the floating diffusion 18, so the read operation is accomplished by simply addressing each pixel as done in prior art. In this case a reset level cannot be read line by line, thus it is not possible to perform correlated double sampling, as previously discussed.

For the device of FIG. 1B, the read operation is accomplished by first resetting the floating diffusion by turning reset gate 27 on; next reading the reset level, then pulsing transfer gate 36 on while turning storage region 38 off. The charge has now been transferred to the floating diffusion, and the signal charge can be read. This architecture provides the capability to do correlated double sampling. Refer to FIG. 6B.

Antiblooming Control During Storage and Readout

Antiblooming control during integration can be accomplished in a similar manner to that of prior art APS devices. This is done by keeping the reset gate on during integration so that any excess photoelectrons generated in the photodetector can spill over the transfer gate onto the floating diffusion and be removed via the reset drain. This method cannot be used to provide antiblooming control during readout of prior art or present invention devices. If the incident image changes such that an extremely bright region appears during the readout period, excess photoelectrons will be generated in the short readout time and corrupt the signal electron packet that is being sensed on the floating diffusion. This will be more problematic in the present invention since the time of the storage operation can exceed the time of the readout operation. A new means for antiblooming control during readout and storage operation is thus required. This is presented and described in the following paragraph. It should be noted that this new method for antiblooming control during readout is useful for APS that do not utilize frame integration. The prior art APS mode of line by line integration can be improved by inclusion of a VOD or LOD in the prior art pixel that does not contain a light shield, so that blooming cannot occur during readout in this mode of operation. In addition the presence of the VOD 14 suppresses cross-talk between pixels.

Antiblooming is controlled by adjusting the electrostatic barrier to the VOD 14 such that it is deeper than the off potential for the transfer gate 16 for the case of FIG. 1A (or transfer gate 26 for the case of FIG. 1B). This will allow excess electrons generated by any bright object in the scene to spill into the VOD 14, and not bloom into the floating diffusion 18 (or floating diffusion 28 for the case of FIG. 1B) or other areas of the same pixel or adjacent pixels and cause undesired blooming artifacts.

Antiblooming control can be done similarly with a lateral overflow drain (not shown), using either a physical gate or a virtual gate adjacent to the photodiode. The potential of the electrostatic barrier to the lateral overflow drain (LOD) must also be deeper than that of the transfer gate. This approach adversely affects the fill factor for a given pixel size since area must be allocated to the LOD structure. A VOD provides blooming control without impacting fill.

Electronic Shutter Operation

Electronic shuttering refers to the ability to shutter the imager without the need for a mechanical or electro-optic device to block the incident light. Electronic shuttering is accomplished by having a light shielded charge storage region in each pixel, (floating diffusion 18 in this case of FIG. 1A, storage region 38 for FIG. 11B), and an overflow drain for the photodiode (VOD 14 in the case of the preferred embodiment being discussed, herein). As described in discussion relating to integration operation, the shutter or integration time is simply time between reset and transfer, or the time between turning off the LOD (or the VOD 14) and transfer. Typically the LOD is turned on by application of a signal pulse to the lateral overflow gate, or the VOD 14 is turned on by applying a signal pulse to the VOD 14 itself After the charge is transferred to light shielded floating diffusion (18 or 28) or storage region 38, it can then be stored or read out without being affected by the incident light because electrons are now not photo-generated in the floating diffusion (18 or 28) or storage region 38, and electrons generated in the photodiode during the storage and read out interval cannot spill over into the floating diffusion 18 or storage region 38 regions since they are taken out by the VOD 14.

The invention has been described with reference to a preferred embodiment. However, it will be appreciated that variations and modifications can be effected by a person of ordinary skill in the art without departing from the scope of the invention.

PARTS LIST 4 color filter array
5 prior art pixel
6 micro-lens
8 light shield
9 light shield aperture
10 pixel of the first preferred embodiment
11 photodetector area
12 photodiode
14 VOD
15 photodetector area
16 transfer gate
17 reset gate
18 floating diffusion
19 reset drain
20 2nd preferred embodiment of the present invention
25 amplifier area
26 transfer gate
27 reset gate
28 floating diffusion
29 drain
36 transfer gate
38 storage region

What is claimed is:

1. An image sensing device comprising:
    a semiconductor material with at least one pixel such that the pixel has a photodetector region upon which incident light will form photoelectrons to be collected as a signal charge, and means for transferring the signal charge from the photodetector region to a sense node connected to an input on an amplifier;
    a pixel having the photodetector arranged such that there is two-dimensional symmetry about the photodetector center.

2. The pixel of claim 1 wherein the improvement further comprises a color filter over at least a portion of the photodetector.

3. The active pixel of claim 1 wherein the improvement further comprises a microlens over the pixel.

4. The pixel of claim 1 wherein the symmetric photodetector further comprises either one of the following: a square photodetector; or a rectangular photodetector.

5. The sensor of claim 1 wherein the sensor has a plurality of pixels formed in an X-Y matrix.

6. The sensor of claim 1 wherein the sensor has a plurality of pixels formed in a straight line.

7. An active pixel sensor having a semiconductor material with at least one pixel formed, thereon, the pixel further comprising:
    a photodetector region upon which incident light will form photoelectrons to be collected as a signal charge, the photodetector being formed such that it has two-dimensional symmetry about its center, means for transferring the signal charge from the photodetector region to a charge storage region, a sense node that is an input to an amplifier, the sense node being operatively connected to the signal storage region.

8. The sensor of claim 7 wherein the sensor has a plurality of pixels formed in an X-Y matrix.

9. The sensor of claim 7 wherein the sensor has a plurality of pixels formed in a straight line.

10. An active pixel sensor a semiconductor material having at least one pixel formed, thereon; such that the pixel further comprises:
    a photodetector region formed to have two-dimensional symmetry about its center upon which incident light will form photoelectrons to be collected as a signal charge, a color filter above the photodetector region, means for transferring the signal charge from the photodetector region to a charge storage region, a sense node that is an input to an amplifier, the sense node being operatively connected to the signal storage region.

11. The pixel of claim 10 wherein the pixel further comprises a light shield over the charge storage region having an aperture above the photodetector region.

12. The pixel of claim 11 further comprising a color filter above the aperture.

13. The pixel of claim 12 further comprising a micro-lens above the color filter.

14. An active pixel sensor having a semiconductor material with at least one pixel formed, thereon, the pixel further comprising:
    a photodetector region that is symmetric about its center having a color filter formed, thereon, upon which incident light will form photoelectrons to be collected as a signal charge;
    means for transferring the signal charge from the photodetector region to a charge storage region; and
    a sense node that is an input to an amplifier, the sense node being operatively connected to the signal storage region.

15. The active pixel sensor of claim 14 wherein the photodetector region further comprises a microlens formed over the color filter array.

16. An active pixel sensor having a semiconductor material with at least one pixel formed, thereon, the pixel further comprising:
    a photodetector region that is symmetric about its center having a microlens formed, thereon, upon which incident light will form photoelectrons to be collected as a signal charge;
    means for transferring the signal charge from the photodetector region to a charge storage region; and
    a sense node that is an input to an amplifier, the sense node being operatively connected to the signal storage region.

17. The active pixel sensor of claim 16 wherein the photodetector region further comprises a color filter formed between the photodetector and the microlens.

18. An active pixel sensor having simultaneous integration and transfer comprising:
    a semiconductor material with a plurality of pixels formed, thereon, wherein each of the plurality of pixels further comprise:
    a photodetector region that is symmetric about its center upon which incident light will form photoelectrons to be collected as a signal charge;
    a charge storage region;
    a transfer gate separating the charge storage region from the photodetector;
    means for biasing the transfer gate to facilitate transfer of charge from the photodetector to the charge storage region; and a sense node that is an input to an amplifier, the sense node being operatively connected to the charge storage region.

19. The sensor of claim 18 wherein the sense node is the charge storage region.

20. An active pixel sensor having a semiconductor material with at least one pixel formed, thereon, the pixel further comprising:

a photodetector region having a microlens formed, thereon, upon which incident light will form photoelectrons to be collected as a signal charge;

means for transferring the signal charge from the photodetector region to a charge storage;

a drain operatively coupled to the pixel; and a sense node that is an input to an amplifier, the sense node being operatively connected to the charge storage region.

21. The sensor of claim 20 wherein the drain is a vertical overflow drain.

* * * * *